United States Patent [19]

Schreck et al.

[11] Patent Number: 5,023,837

[45] Date of Patent: Jun. 11, 1991

[54] BITLINE SEGMENTATION IN LOGIC ARRAYS

[75] Inventors: John F. Schreck, Houston; Debra J. Dolby, Missouri City, both of Tex.

[73] Assignee: Texas Instruments Incorporated, Dallas, Tex.

[21] Appl. No.: 402,402

[22] Filed: Sep. 5, 1989

[51] Int. Cl.⁵ .............................................. G11C 11/40
[52] U.S. Cl. ................................. 365/185; 365/189.09
[58] Field of Search ........... 365/104, 182, 185, 189.09, 365/230.03

[56] References Cited

U.S. PATENT DOCUMENTS

| 4,281,397 | 7/1981 | Neal et al. | 365/185 |
| 4,301,518 | 11/1981 | Klaas | 365/185 |
| 4,387,447 | 6/1983 | Klaas et al. | 365/185 X |

Primary Examiner—Joseph A. Popek
Attorney, Agent, or Firm—W. James Brady, III; James T. Comfort; Melvin Sharp

[57] ABSTRACT

The memory array circuit this invention provides connection of segmented bitlines to bitline decoding circuitry while, at the same time, providing connection of combined wordlines wordline decoding circuitry. The segmentation and decoding connections permit faster speed of operation with minimal or no area penalty. The area penalty is avoided by driving common wordlines in each of the segments, effectively increasing the wordline pitch at the wordline decoder, while at the same time decreasing the number of wordline decodes required. The segmentation also permits location of the decoder circuit away from the signal and routing decode outputs.

23 Claims, 3 Drawing Sheets

BITLINE SEGMENTATION IN LOGIC ARRAYS

BACKGROUND OF THE INVENTION

This invention relates to segmentation of bitlines in integrated-circuit logic memory arrays.

The speed of access to information contained in nonvolatile memory arrays is largely dependent on the capacitance of the bitlines and the wordlines. Those capacitances are a function of choices that include the lengths of the bitlines and wordlines, pitch, bar size and aspect ratio, and process parameters. In general, small capacitances are required for fast access time during operation of memory arrays. Conventional segmentation with separate driver circuitry for each segmented wordline and for each segmented bitline is generally impermissible because that method of reducing the access time delay requires an unacceptable increase in driver circuit area on integrated circuit chips.

Virtual-ground arrays, such as those of U.S. Pat. No. 4,281,397 issued July 28, 1981 and assigned to Texas Instruments Incorporated, permit a very efficient use of space for memory cells. As the size of each floating-gate memory cell decreases and as the number of memory elements in each row and each column increases, the lengths of the wordlines and bitlines generally remain the same. Therefore, the capacitance and the access time delay associated with those bitlines and wordlines also remain the approximately the same. However, as the number of cells increases, there is a need for a smaller access time delay in retrieving the increased amount of information contained in the dense memory arrays.

Accordingly, there is a need for a circuit arrangement that permits rapid access time during operation of virtual-ground memory circuit arrays while at the same time minimizing the increase in area required for driver circuitry on those arrays.

SUMMARY OF THE INVENTION

The circuit arrangement of this invention includes segmentation of bitlines for connection to bitline decoding circuitry while, at the same time, combining wordlines of the various segments for connection to wordline decoding circuitry.

The segmentation and decoding connection described and claimed herein permits faster speed of operation with minimal or no area penalty. The area penalty is avoided by driving common wordlines in each of the segments, effectively increasing the wordline pitch at the wordline decoder, while at the same time decreasing the number of wordline decodes required. The segmentation also permits location of the decoder circuit away from the signal and routing decode outputs.

BRIEF DESCRIPTION OF THE DRAWINGS

The novel features of this invention are set forth in the appended claims. The invention, its features, and its advantages are described below in conjunction with the following drawings:

DETAILED DESCRIPTION OF THE SPECIFIC EMBODIMENT

Figure 1:
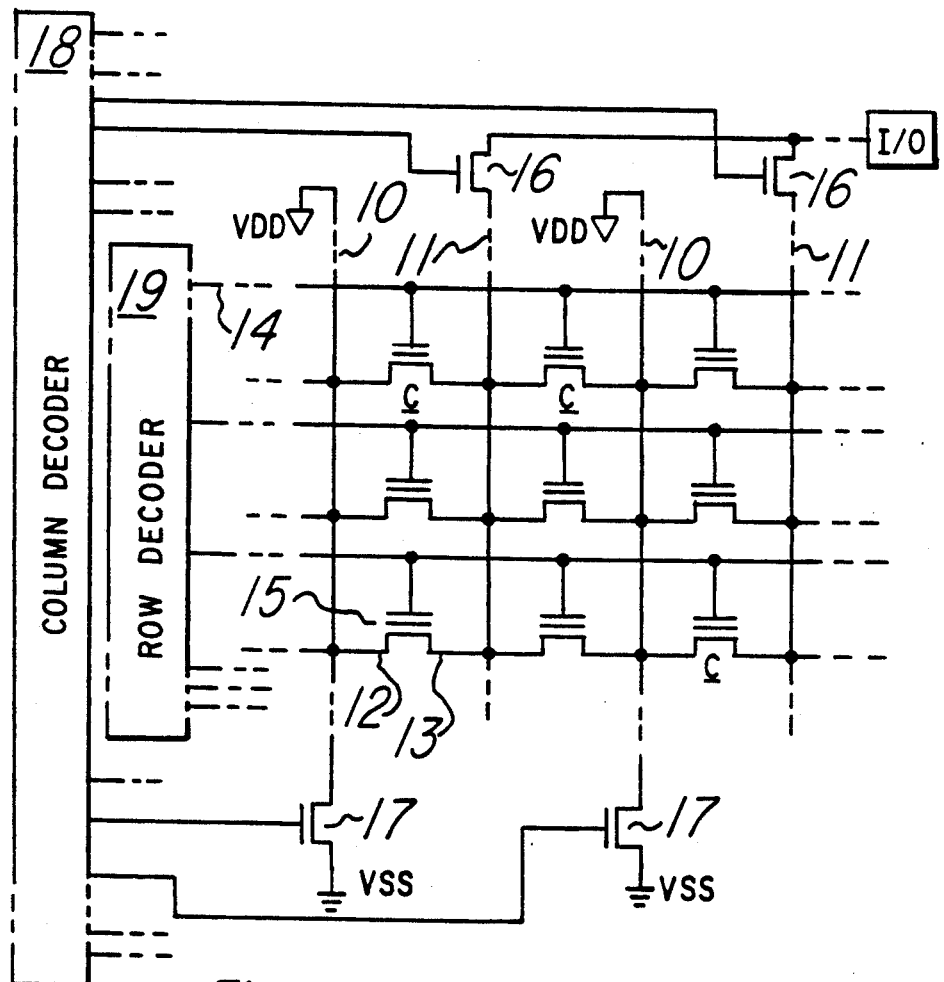
FIG. 1 illustrates a schematic diagram, in partial block form, of a prior-art virtual-ground memory array.

Referring to FIG. 1, a prior-art virtual-ground memory array similar to that described in U.S. Pat. No. 4,281,397 is illustrated in schematic form. Ground-column, or virtual-ground, lines 10 and output-column lines, or bitlines, 11 are connected in non-segmented form to first and second electrodes, or sources and drains, 12 and 13 of floating-gate memory cells C. Virtual-ground arrays typically have a difference of one between the number of output-column lines 11 and the number of virtual-ground lines 10. Wordlines 14 are connected to control electrodes, or control gates, 15 of the floating-gate memory cells 00–77. A megabit array may have perhaps 1024 rows and 1024 columns of memory cells C.

Each output-column line 11 of the prior-art circuit of FIG. 1 is connected at one end through a first logic switch, illustrated as a pass-gate transistor, 16 to one or more input/output circuits I/0, which include sense amplifiers and other circuitry for programming and reading the memory cells C. Each ground-column line 10 is connected at one end to a source of potential Vdd and at the other end through a second logic switch, illustrated as a pass-gate transistor, 17 to a source of reference potential, Vss, shown as the circuit ground. Potential source Vdd may include a resistor or a diode-connected transistor in series with an energy source. Each of the gates of first pass-gate transistors 16 is connected to a separate output of column decode circuit 18. Each of the gates of second pass-gate transistors 17 is also connected to an output of a column decode circuit 18. The circuit elements of column decode circuit 18 may, of course, be distributed throughout the array to minimize the chip area required for conductors.

Each wordline 14 of the prior-art circuit of FIG. 1 is separately connected to an output of row decode circuit 19. The circuit elements of row decode circuit 19 may also be distributed throughout the array to minimize the chip area required for conductors.

Figure 2:
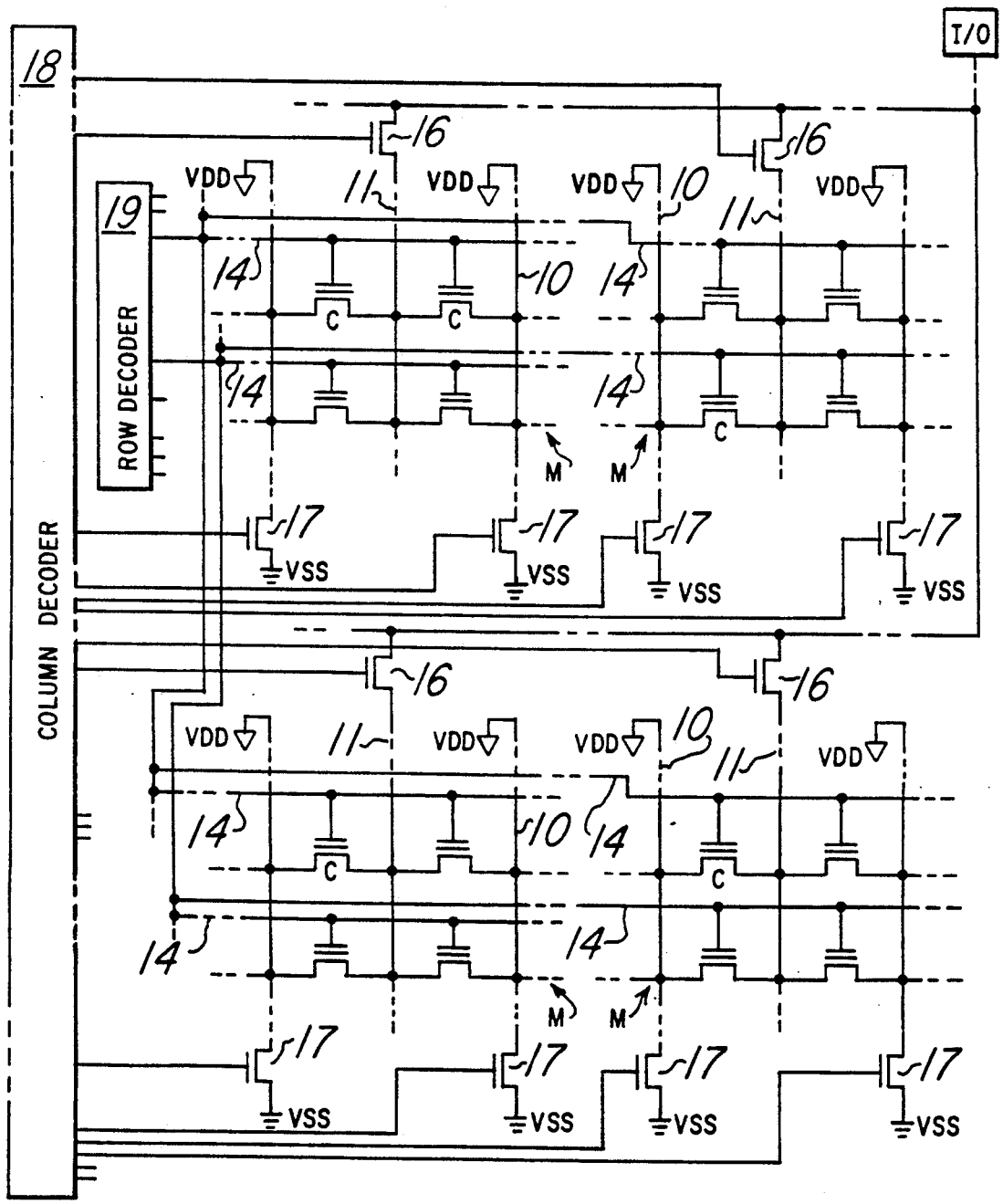
FIG. 2 illustrates a schematic diagram, in partial block form, of electrical connections for example of segmented bitlines and segmented virtual-ground lines according to one embodiment of this invention.

Referring to FIG. 2, in accordance with this invention ground-column lines 10 and output-column lines 11 are segmented and are connected to the source and drain electrodes of segmented columns of memory cells in each of several modules M. A megabit array, for example, has been constructed with eight rows and two columns of modules M, each module M having 128 rows and 512 columns of such memory cells. The segmented column lines 11 of FIG. 2 have less capacitance than the capacitance of the longer column lines of prior-art FIG. 1, assuming the same type of fabrication is used and assuming the same total number of memory cells in the same size array. Consequently, the access time to each memory cell is improved. Each module M typically has a difference of one between the number of segmented output-column lines 11 and the number of segmented ground-column lines 10. Each segmented output-column line 11 is connected at one end through a first pass-gate transistor 16 to one or more input/output circuits I/0. Each segmented ground-column line 10 is connected at one end to a voltage supply source Vdd and at the other end through a second pass-gate transistor 17 to a source of reference potential, Vss, shown as the circuit ground. Each of the gates of first pass-gate transistors 16 is connected to a separate output of column decode circuit 18. Each of the gates of second pass-gate transistors 17 is also connected to an output of column decode circuit 18.

Each wordline 14 of a module M of FIG. 2 is electrically connected to one wordline 14 of each of the other modules M. Each set of series and parallel connected wordlines 14 is connected to a separate output of row decode circuit 19, which requires fewer levels of decode circuitry as compared to the row decode circuit 19 of FIG. 1 because of the fewer number of output signals required. While the wordlines 14 of modules M other than the selected wordline 14 of the selected module M are energized during operation, the segmented ground-column lines 10 and the segmented output-column lines 11 allow operation to be limited to the cell selected, as explained hereinafter.

Assuming the same number of memory cells C in FIG. 1 and FIG. 2 with the same number of equivalent unsegmented rows and columns, the number of outputs of the column decode circuit 18 of FIG. 2 is greater than the number of outputs of the column decode circuit 18 of FIG. 1 because of the increased number of second pass-gate transistors 17 and first pass-gate transistors 16. However, under the same assumption, the number of outputs of the row decode circuit 19 of FIG. 2 is less than the number of outputs of the row decode circuit 19 of FIG. 1 because of the decreased number of wordline 14 connections. For example, if the modules M of FIG. 2 are formed such that the wordlines 14 of the FIG. 1 array are divided into eight equal groups, then the number of required wordline 14 decode signals furnished by row decode circuit 19 is divided by a factor of eight as compared to the number required in FIG. 1. At the same time, however, the number of segmented ground-column lines 10 and segmented output-column lines 11 is multiplied by a factor of perhaps slightly more than eight as compared to the number required in FIG. 1, requiring the number of signals from column decode circuit 18 to be multiplied by that factor. (If a virtual-ground configuration is used, the number is slightly more than eight because each module M may have an even number of segmented output-column lines 11 and an odd number of segmented ground-column lines 10.) Therefore, column decode circuit 18 of FIG. 2 requires added levels of logic circuitry in comparison to column decode circuit 18 of FIG. 1. However, row decode circuit 19 of FIG. 2 requires fewer levels of logic circuitry in comparison to row decode circuit 19 of FIG. 1, resulting in little overall change in driver circuit space required, yet the speed of FIG. 2 non-volatile memory array is improved over the speed of the FIG. 1 non-volatile memory array.

Figure 3:
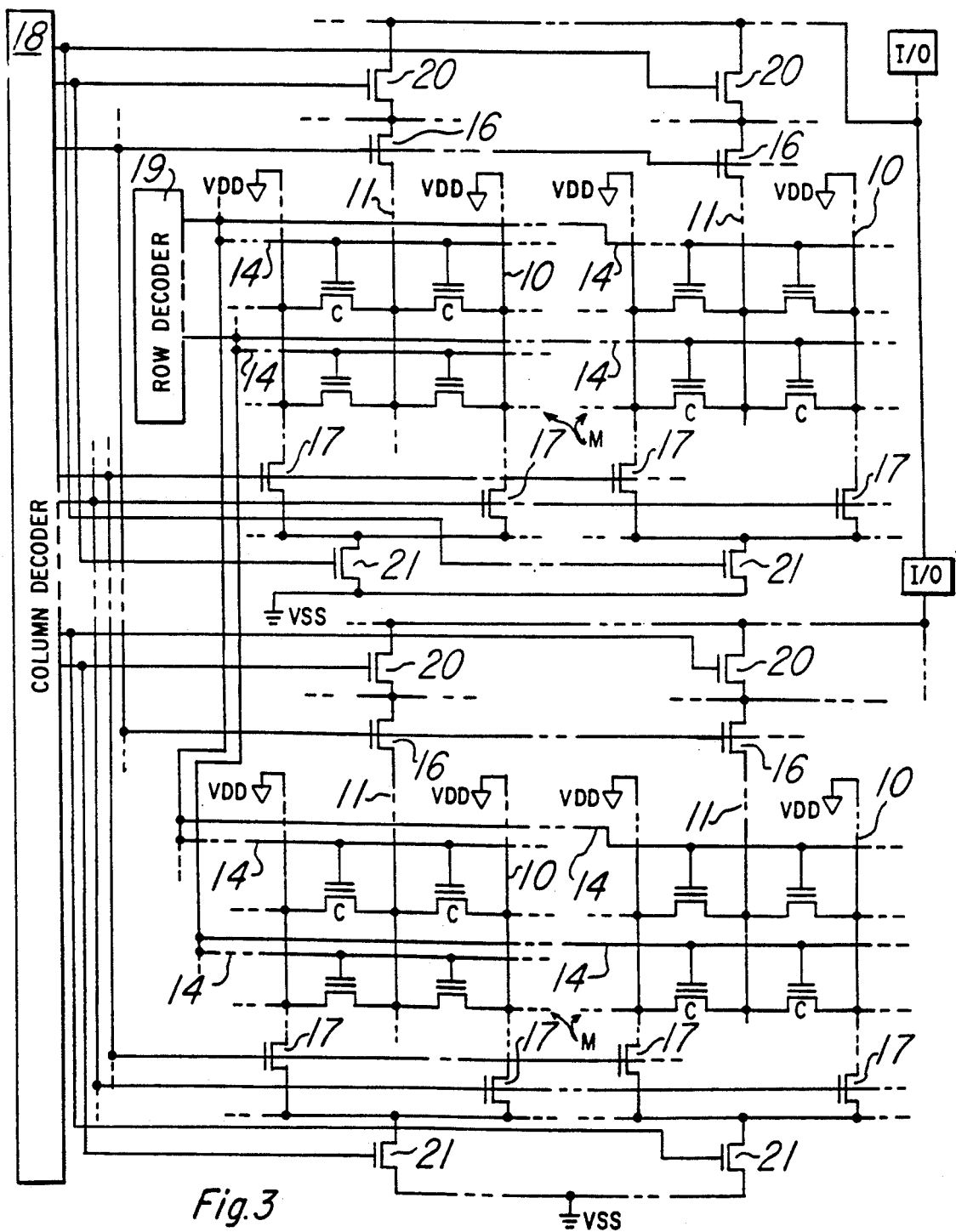
FIG. 3 illustrates a schematic diagram, in partial block form, of an alternative connection for the virtual-ground column lines of FIG. 2.

Referring to FIG. 3, the first pass-gate transistors 16 of each module M may be connected to one or more input output circuits I/0 through third logic switches, shown as pass-gate transistors, 20. Similarly, the second pass-gate transistors 17 of each module M may be connected to reference voltage source Vss through fourth logic switches, shown as pass-gate transistors, 21. First and third logic switches 16 and 20 may be combined and may be located with the decoder circuitry, as may second and fourth logic switches 17 and 21. The columns of the various modules may be connected in parallel or may be operated in parallel. The column decode circuit 18 of FIG. 3 requires the same levels of decoding signals as the column decode circuit 18 of FIG. 2. The gates of third pass-gate transistors 20 and fourth pass-gate transistors 21 are connected to outputs of column decode circuit 18, which must have the same level of complexity as the column decode circuit 18 of FIG. 2.

Use of third pass-gate transistors 20 or fourth pass-gate transistors 21 to select modules is advantageous because of the reduction in parasitic loading compared to the loading with all of the second pass-gate transistor 17 or first pass-gate transistor 16 outputs on a common node, as in FIG. 1.

The virtual-ground lines 10 need not be decoded at each line as shown in the FIGS. Instead, the virtual-ground lines 10 may be passed to decoded lines that are decoded in another location, thereby reducing the space requirement for the virtual-ground decoder circuitry of decoder 18 and reducing the number of transistors in series located within the array boundary. This is important for EPROMs because the paths in the array must conduct large currents for programming. The series transistors that are moved out of the array boundary can be located in a less confined area where the larger size will not impact the spacing between cells. Bitlines 11 and virtual-ground lines 10 may have different functions in the read and programming modes. For example, bitlines 11 may be grounded when selected in the program mode and may be connected to the sense amplifier when selected in read mode. At the same time, virtual-ground lines 10 may be connected to high voltage when selected in the program mode and may be grounded when selected in the read mode.

The circuit of this invention may be used for non-virtual-ground memory arrays, in which case the decoding circuitry for virtual-ground lines 10 is not needed. And where virtual-ground lines 10 are used, the virtual-ground lines 10 may not be segmented as shown in the FIGS. 2 and 3, while the bitlines 11 remain segmented. High capacitance virtual-ground lines 10 are not a problem because they can be driven easily. Area would be saved by eliminating the need for pass gate transistors between each module for the virtual-ground lines 10. However, elimination of the segmented virtual-ground lines 10 may cause adverse results during electrical programming.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

We claim:
1. A non-volatile memory array comprising:
a plurality of rows of modules, each said module including a plurality of rows of memory cells and a plurality of columns of memory cells, wherein each memory cell has a control electrode and a current path between first and second electrodes;
a plurality of row lines in each said module, each said row line connected to said control electrodes of each memory cell in a respective one of said rows of memory cells;
a plurality of ground-column lines and of segmented output-column lines, each of said first electrodes of said memory cells connected to a said ground-column line, each of said second electrodes of said memory cells connected to a said segmented output-column line, each said segmented output- column line connected to an input/output circuit line through a first logic switch;

a row decode means for selecting and accessing said row lines;

a column decode means for selecting and activating said segmented output-column lines;

wherein each of said row lines of a said module is electrically connected to a row line of each of the others of said modules; and wherein outputs of said column decode means are electrically connected to control electrodes of said first logic switches.

2. The memory carry of claim 1, wherein said ground-column lines of said memory array are segmented, wherein each said ground-column line is electrically connected at one end to a voltage supply source and is electrically connected at the other end through a second logic switch to a source of reference potential, and wherein outputs of said column decode means are electrically connected to control electrodes of said second logic switches.

3. The memory array of claim 1, wherein each of said first logic switches of a said module is electrically connected to said input/output circuit through a third logic switch, and wherein third logic switch is electrically connected to an output of said column decode means.

4. The memory array of claim 1, wherein each said ground-column line of said memory array is segmented, wherein each of said first electrodes of memory cells in each of said plurality of columns of cells in a module is connected to a said segmented ground-column line, wherein each said ground-column line is electrically connected at one end to a voltage supply source and is electrically connected at the other end through a second logic switch to a source of reference potential, wherein outputs of said column decode means are electrically connected to control electrodes of said second logic switches, wherein each of said second logic switches of a said module is electrically connected to said source of reference potential through a third logic switch, and wherein said third logic switch is electrically connected to an output of said column decode means.

5. A non-volatile memory array comprising:

a plurality of rows of modules, each said module including a plurality of rows of memory cells and a plurality of columns of memory cells, wherein each memory cell has a control gate and a current path between a source and a drain;

a plurality of row lines, each said row line connected to said control gates of each memory cell in a respective one of said rows of memory cells;

a plurality of first and second segmented column lines, each source of said memory cells connected to a first said segmented column line, each drain of said memory cells connected to a second said segmented column line, each said first segmented column line connected to a source of electrical potential, each said second segmented column line connected through a first pass-gate transistor to an input/output circuit;

a row decode circuit for selecting and accessing said row lines;

a column decode circuit for selecting and activating said segmented column lines;

wherein each of said row lines of a said module is electrically connected to a row line of each of the others of said modules; and wherein outputs of said column decode circuit are electrically connected to gates of said first pass-gate transistors.

6. The memory array of claim 5, wherein each said first segmented-column line is electrically connected at one end to a voltage supply source and is electrically connected at the other end through a second pass-gate transistor to a source of reference potential, and wherein outputs of said column decode circuit are electrically connected to gates of said second pass-gate transistors.

7. The memory array of claim 5, wherein each of said first pass-gate transistors is electrically connected to said input/output circuit through a second pass-gate transistor, and wherein the gate of said second pass-gate transistor is electrically connected to an output of said column decode circuit.

8. The memory array of claim 5, wherein each said first segmented column line of said memory array is electrically connected at one end to a voltage supply source and is electrically connected at the other end through a second pass-gate transistor to a source of reference potential, wherein outputs of said column decode circuit are electrically connected to gates of said second pass-gate transistors, wherein each of said second pass-gate transistors of a said module is electrically connected to said source of reference potential through a third pass-gate transistor, and wherein a gate of each said third pass-gate transistor is electrically connected to an output of said column decode circuit.

9. A non-volatile memory array comprising:

a plurality of rows and columns of modules, each said module including a plurality of rows of memory cells and a plurality of columns of memory cells, wherein each memory cell has a control electrode and a current path between first and second electrodes;

a plurality of row lines in each said module, each said row line connected to said control electrodes of each memory cell in a respective one of said rows of memory cells;

a plurality of ground-column lines and of segmented output-column lines in each said module, each of said first electrodes of said memory cells connected to a said ground-column line, each of said second electrodes of said memory cells connected to a said output-column line, each said ground-column line connected to at least one source of voltage potential, each said output-column line connected through a first logic switch and through a second logic switch, to an input/output circuit;

a row decode circuit for selecting and accessing said row lines;

a column decode circuit for selecting and activating said segmented output-column lines;

wherein each of said row lines of a said module is electrically connected to a row line of each of the others of said modules;

wherein each of said output-column lines of a said module is electrically connected to an output-column line of each of the others of said modules; and wherein outputs of said column decode circuit are electrically connected to gates of said first logic switches and said second logic switches.

10. The memory array of claim 9, wherein said ground-column lines of said memory array are segmented, wherein each said ground-column line is electrically connected at one end to a voltage supply source and is electrically connected at the other end through a third logic switch to a source of reference potential, and wherein outputs of said column decode circuit are electrically connected to gates of said third logic switches.

11. The memory array of claim 9, wherein each said ground-column line of said memory array is segmented, wherein each of said first electrodes of memory cells in each of said plurality of columns of cells in a module is connected to a respective one of said segmented ground-column lines, wherein said ground-column line is electrically connected at the other end through a third logic switch to a source of reference potential, wherein outputs of said column decode circuit are electrically connected to each of said third logic switches, wherein each of said third logic switches of a said module is electrically connected to said source of reference potential through a fourth logic switch, and wherein said fourth logic switch is electrically connected to an output of said column decode circuit.

12. A memory array comprising:
a plurality of rows and columns of modules, each of said modules including a plurality of rows and columns of memory cells and a plurality of wordlines, each of said memory cells having a control electrode, a first electrode, and a second electrode, each of said wordlines coupled to the control electrodes of the memory cells in a respective one of said rows of memory cells; and
a row decoder for simultaneously selecting one of said plurality of wordlines in each of said modules.

13. A memory array as in claim 12 in which said row decoder includes a plurality of first output terminals, each of said first output terminals coupled to a respective one of said wordlines in each of said modules.

14. A memory array as in claim 12 in which each of said modules further includes a plurality of segmented bitlines, each of said segmented bitlines coupled to the second electrodes of memory cells in a respective one of said columns of memory cells.

15. A memory array as in claim 14 further comprising a column selecting means for selecting one of said plurality of segmented bitlines.

16. A memory array as in claim 15 in which said column selecting means includes a plurality of first logic switches and a column decoder having a plurality of output terminals, each of said output terminals coupled to a control electrode of a respective one of said first logic switches, each of said first logic switches coupled between a respective one of said segmented bitlines and an input/output circuit.

17. A memory array as in claim 15 in which said column selecting means includes a plurality of first logic switches, a plurality of second logic switches, and a column decoder having a plurality of first output terminals and a plurality of second output terminals, each of said first logic switches coupled to a respective one of said segmented bitlines, each of said second logic switches coupled between those first logic switches coupled to the segmented bitlines of a respective one of said modules and an input/output circuit, each of said first output terminals coupled to control electrodes of respective ones of said first logic switches, each of said respective ones of said first logic switches being coupled to a segmented bitline in a separate module, each of said second output terminals coupled to a control electrode of a respective one of said second logic switches.

18. A memory array as in claim 12 further comprising a plurality of ground column lines, each ground-column line coupled to the first electrodes in a respective one of said plurality of columns of memory cells in each module in a column of modules, each ground-column line coupled at one end to a voltage source and at the other end through a first logic switch to a source of reference potential.

19. A memory array as in claim 12 in which each module includes a plurality of segmented ground-column lines, each segmented ground-column line coupled to the first electrodes in a respective one of said columns of memory cells, each segmented ground-column line coupled at one end to a voltage source and at the other end through a first logic switch to a source of reference potential.

20. A memory array as in claim 19 further comprising a column selecting means for selecting one of said plurality of segmented ground-column lines.

21. A memory array as in claim 20 in which said column selecting means includes a column decoder having a plurality of output terminals, each of said output terminals coupled to a control electrode of a respective one of said first logic switches.

22. A memory array as in claim 20 in which said column selecting means includes a plurality of second logic switches and a column decoder having a plurality of first output terminals and a plurality of second output terminals, each of said second logic switches coupled between those first logic switches coupled to the segmented ground-column lines of a respective one of said modules and said source of reference potential, each of said first output terminals coupled to control electrodes of respective ones of said first logic switches, each of said respective ones of said first logic switches being coupled to a segmented ground-column line in a separate module, each of said second output terminals coupled to a control electrode of a respective one of said second logic switches.

23. A memory array as in claim 12 in which said memory cells are floating gage memory cells.

* * * * *